United States Patent
Hao et al.

(10) Patent No.: US 10,236,462 B2
(45) Date of Patent: Mar. 19, 2019

(54) QUANTUM DOT ELECTROLUMINESCENT DEVICE AND DISPLAY APPARATUS

(71) Applicant: BOE TECHNOLOGY GROUP CO., LTD., Beijing (CN)

(72) Inventors: Xueguang Hao, Beijing (CN); Hongfei Cheng, Beijing (CN); Yong Qiao, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/535,880

(22) PCT Filed: Jul. 13, 2016

(86) PCT No.: PCT/CN2016/089860
§ 371 (c)(1),
(2) Date: Jun. 14, 2017

(87) PCT Pub. No.: WO2017/128635
PCT Pub. Date: Aug. 3, 2017

(65) Prior Publication Data
US 2018/0114936 A1    Apr. 26, 2018

(30) Foreign Application Priority Data
Jan. 27, 2016    (CN) .......................... 2016 1 0055724

(51) Int. Cl.
*H01L 33/06*    (2010.01)
*H01L 51/50*    (2006.01)
(Continued)

(52) U.S. Cl.
CPC ............ *H01L 51/502* (2013.01); *H01L 33/06* (2013.01); *H01L 51/50* (2013.01);
(Continued)

(58) Field of Classification Search
CPC .............................. H01L 51/502; H01L 33/06
(Continued)

(56) References Cited

U.S. PATENT DOCUMENTS

| 8,330,142 B2 | 12/2012 | Cho et al. |
| 8,698,395 B2 | 4/2014 | Im et al. |

(Continued)

FOREIGN PATENT DOCUMENTS

| CN | 101834277 A | 9/2010 |
| CN | 101944570 A | 1/2011 |

(Continued)

OTHER PUBLICATIONS

International Search Report of PCT/CN2016/089860 in Chinese, dated Oct. 31, 2016 with English translation.

(Continued)

*Primary Examiner* — Robert T Huber
(74) *Attorney, Agent, or Firm* — Collard & Roe, P.C.

(57) ABSTRACT

A quantum dot electroluminescent device and a display apparatus are provided. The quantum dot electroluminescent device includes: a first electrode, an electron transport layer, a quantum dot luminescent layer, a hole transport layer and a second electrode, wherein the quantum dot luminescent layer is disposed between the electron transport layer and the hole transport layer; the quantum dot luminescent layer includes a base material layer and a quantum dot luminescent material which is dispersed in the base material layer; a highest occupied molecular orbital energy level of the base material layer is between a highest occupied molecular orbital energy level of the hole transport layer and a highest occupied molecular orbital energy level of the quantum dot luminescent material.

20 Claims, 2 Drawing Sheets

(51) Int. Cl.
*H01L 51/56* (2006.01)
*H01L 27/32* (2006.01)

(52) U.S. Cl.
CPC ...... *H01L 51/5004* (2013.01); *H01L 51/5056* (2013.01); *H01L 51/5072* (2013.01); *H01L 51/56* (2013.01); *H01L 27/32* (2013.01); *H01L 2251/5369* (2013.01)

(58) Field of Classification Search
USPC .................................................. 257/13, 98
See application file for complete search history.

(56) References Cited

U.S. PATENT DOCUMENTS

| 2010/0108984 | A1 | 5/2010 | Cho et al. |
| 2010/0123155 | A1* | 5/2010 | Pickett ................ B82Y 15/00 257/98 |
| 2015/0034926 | A1 | 2/2015 | Nakata et al. |

FOREIGN PATENT DOCUMENTS

| CN | 104106310 A | 10/2014 |
| CN | 105514294 A | 4/2016 |
| JP | 2010-209141 A | 9/2010 |
| KR | 10-2007-0097255 A | 10/2007 |
| KR | 10-2013-0013810 A | 2/2013 |

OTHER PUBLICATIONS

Written Opinion of the International Searching Authority of PCT/CN2016/089860 in Chinese, dated Oct. 31, 2016 with English translation.
First Chinese Office Action in Chinese Application No. 201610055724.5, dated Dec. 30, 2016 with English translation.
Second Chinese Office Action in Chinese Application No. 201610055724.5, dated Jun. 26, 2017 with English translation.
Kang, Byoung-Ho et al. "Enhanced Charge Transfer of QDs/Polymer Hybrid LED by Interface Controlling." IEEE Electron Device Letters, vol. 34, No. 5, May 2013, pp. 656-658.

* cited by examiner

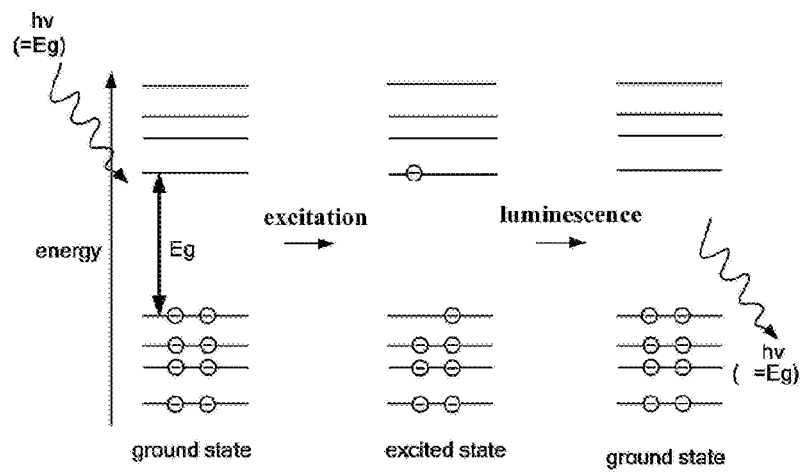

Fig. 3

```
┌─────────────────────────────────────────────────────────────┐
│ holes in the hole transport layer are transferred to the    │
│ base material layer in the quantum dot luminescent layer    │
└─────────────────────────────────────────────────────────────┘
                              ↓
┌─────────────────────────────────────────────────────────────┐
│ holes in the base material layer are transferred to the     │
│ quantum dot luminescent material of the quantum dot         │
│ luminescent layer                                            │
└─────────────────────────────────────────────────────────────┘
```

QUANTUM DOT ELECTROLUMINESCENT DEVICE AND DISPLAY APPARATUS

CROSS REFERENCE TO RELATED APPLICATIONS

This application is the National Stage of PCT/CN2016/089860 filed on Jul. 13, 2016, which claims priority under 35 U.S.C. § 119 of Chinese Application No. 201610055724.5 filed on Jan. 27, 2016, the disclosure of which is incorporated by reference.

TECHNICAL FIELD

Embodiments of the present disclosure relate to a quantum dot electroluminescent device and a display apparatus.

BACKGROUND

At present, an organic light-emitting diode (OLED) generally comprises a hole transport layer and a luminescent layer, wherein a highest occupied molecular orbital (HOMO) energy level of the hole transport layer material is from about 5.0 ev to about 5.3 ev, and a HOMO energy level of the luminescent layer material is from about 5.0 ev to about 5.5 ev. A small difference between the HOMO energy level of the hole transport layer material and the HOMO energy level of the luminescent layer material is beneficial for the improvement of the hole transporting ability, thereby improving the luminous efficiency of the organic electroluminescent device.

SUMMARY

At least one embodiment of the present disclosure provides a quantum dot electroluminescent device which comprises: a first electrode, an electron transport layer, a quantum dot luminescent layer, a hole transport layer and a second electrode; wherein the quantum dot luminescent layer is disposed between the electron transport layer and the hole transport layer; the quantum dot luminescent layer comprises a base material layer and a quantum dot luminescent material which is dispersed in the base material layer; a highest occupied molecular orbital energy level of the base material layer is between a highest occupied molecular orbital energy level of the hole transport layer and a highest occupied molecular orbital energy level of the quantum dot luminescent material.

In at least one embodiment of the present disclosure, the highest occupied molecular orbital energy level of the base material layer is for example from about 5.4 ev to about 6.8 ev.

In at least one embodiment of the present disclosure, the highest occupied molecular orbital energy level of the base material layer is for example from about 5.8 ev to about 6.2 ev.

In at least one embodiment of the present disclosure, the base material layer for example acts as a coating agent or a dispersant of the quantum dot luminescent material.

In at least one embodiment of the present disclosure, the base material layer is for example an organic material, an inorganic material, or a composite of an organic material and an inorganic material.

In at least one embodiment of the present disclosure, the base material layer is formed of for example a base material and an energy level transition material doped in the base material, or the base material layer is made of an energy level transition material. A highest occupied molecular orbital energy level of the energy level transition material is between the highest occupied molecular orbital energy level of the hole transport layer and the highest occupied molecular orbital energy level of the quantum dot luminescent material.

In at least one embodiment of the present disclosure, the energy level transition material for example comprises at least one of the following organic materials: a phosphate organic compound; a thiol organic compound; a carboxylic acid organic compound.

For example, in a case that the energy level transition material comprises at least two of the phosphate organic compound, the thiol organic compound and the carboxylic acid organic compound, the energy level transition material is made by polymerization of the at least two.

In at least one embodiment of the present disclosure, the quantum dot luminescent layer has a thickness of for example from about 10 nm to about 450 nm.

In at least one embodiment of the present disclosure, the quantum dot luminescent layer has a thickness of for example from about 55 nm to about 400 nm.

In at least one embodiment of the present disclosure, the quantum dot luminescent material comprises for example at least one of a red quantum dot material, a green quantum dot material and a blue quantum dot material.

In at least one embodiment of the present disclosure, for example, the light produced by the quantum dot luminescent layer exits from a side at which the first electrode is located, and a transparent protective layer is disposed on a side of the first electrode away from the quantum dot luminescent layer; and/or the light produced by the quantum dot luminescent layer exits from a side at which the second electrode is located, and a transparent protective layer is disposed on a side of the second electrode away from the quantum dot luminescent layer.

At least one embodiment of the present disclosure further provides a display apparatus which comprises the quantum dot electroluminescent device described above.

BRIEF DESCRIPTION OF THE DRAWINGS

In order to clearly illustrate the technical solutions of the embodiments of the present disclosure, the drawings of the embodiments will be briefly described in the following. Apparently, the described drawings are only related to some embodiments of the present disclosure and thus are not limitative of the disclosure.

FIG. 3 is a schematic diagram of the working principle of the quantum dot electroluminescent device illustrated in FIG. 1; and FIG. 4 is a flow chart of hole transporting in a quantum dot electroluminescent device provided by an embodiment of the present disclosure.

DETAILED DESCRIPTION

In order to make objects, technical solutions and advantages of the embodiments of the present disclosure apparent, the technical solutions of the embodiments will be described in a clear and detailed way in connection with the drawings. It is obvious that the described embodiments are just a part but not all of the embodiments of the disclosure. Based on the described embodiments herein, those skilled in the art can obtain other embodiment(s), without any inventive work, which should be within the protection scope of the disclosure.

If the hole transport layer material in an organic electroluminescent device is applied in a quantum dot electroluminescent device, there will be a large band shift between the hole transport layer material and the quantum dot luminescent material since the highest occupied molecular orbital energy level of the quantum dot luminescent material is about 6.8 ev, and the highest occupied molecular orbital energy level of the hole transport layer material is low. As such, the efficiency of the hole injection from the hole transport layer to the quantum dot luminescent layer is reduced, which makes the hole migration difficult, and thus the luminescence efficiency of the quantum dot electroluminescent device is reduced.

At least one embodiment of the present disclosure provides a quantum dot electroluminescent device and a display apparatus, and the display apparatus comprises the quantum dot electroluminescent device. The quantum dot electroluminescent device is capable of improving the efficiency of the hole injection from the hole transport layer to the quantum dot luminescent layer, which makes the hole migration easy and thus improves the luminescence efficiency of the quantum dot electroluminescent device.

Figure 1:
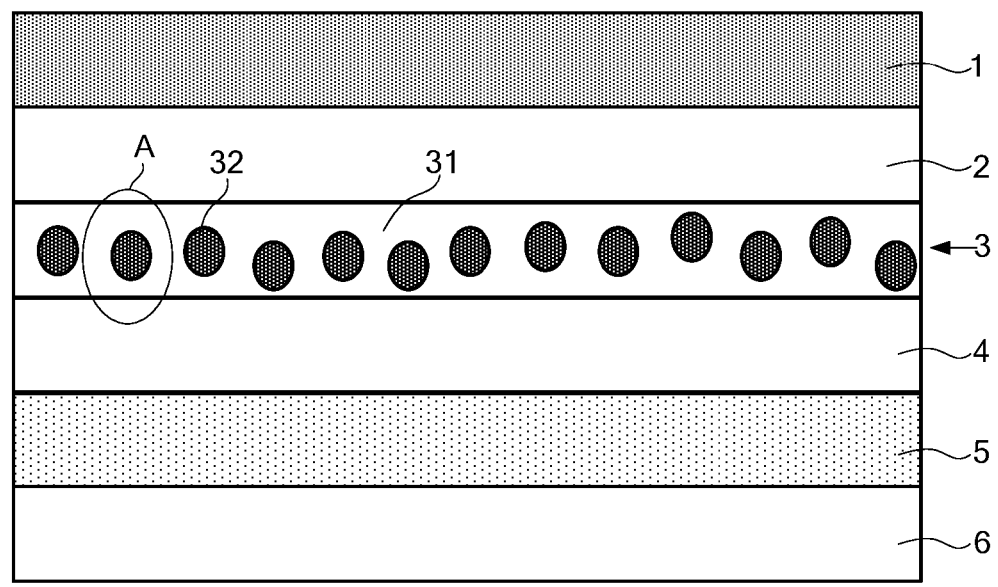
FIG. 1 is a schematic structure diagram of a quantum dot electroluminescent device provided by an embodiment of the present disclosure.

As illustrated in FIG. 1, the quantum dot electroluminescent device provided by an embodiment of the present disclosure comprises: a first electrode 1, an electron transport layer 2, a quantum dot luminescent layer 3, a hole transport layer 4 and a second electrode 5; the quantum dot luminescent layer 3 is disposed between the electron transport layer 2 and the hole transport layer 4; the quantum dot luminescent layer 3 comprises a base material layer 31 and a quantum dot luminescent material 32 which is dispersed in the base material layer 31; a highest occupied molecular orbital energy level of the base material layer 31 is between a highest occupied molecular orbital energy level of the hole transport layer 4 and a highest occupied molecular orbital energy level of the quantum dot luminescent material 32.

Figure 2:
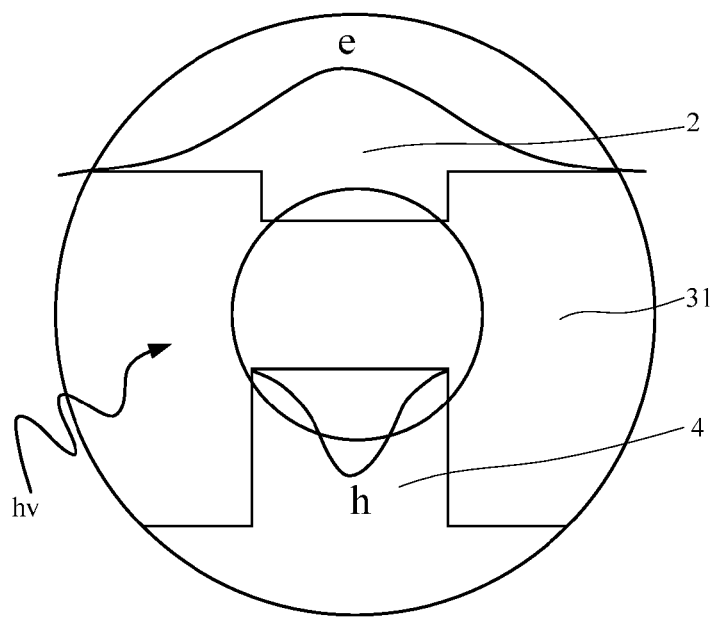
FIG. 2 is a schematic diagram of the working principle of the A part in FIG. 1.

As illustrated in FIG. 2 and FIG. 3, the luminescent principle of the quantum dot luminescent material 32 of the quantum dot electroluminescent device is as follows: holes h from one of the first electrode 1 and the second electrode 5 are injected into the highest occupied molecular orbital energy level of the hole transport layer 4, whereas electrons e are injected into the lowest occupied molecular orbital energy level of the electron transport layer 2; both the electrons e and the holes h migrate to the quantum dot luminescent layer 3 simultaneously; because the highest occupied molecular orbital energy level of the hole transport layer 4 is close to the highest occupied molecular orbital energy level of the base material layer 31 in the quantum dot luminescent layer 3, the holes h preferentially occupy the highest occupied molecular orbital energy level of the base material layer 31; the holes h are then injected into the quantum dot luminescent material 32 from the highest occupied molecular orbital energy level of the base material layer 31; the holes h and the electrons e are combined in the quantum dot luminescent material 32 to form excitons; the energy hv of the holes h is increased upon obtaining the electrons e, and the holes h are transited from a ground state to an excited state; excitons are freely diffused continuously in the quantum dot luminescence material 32, and inactivated in a manner of radiation or non-radiation. A phenomenon of electroluminescence can be observed when the excitons return from the excited state to the ground state in a radiative transition manner.

In the above quantum dot electroluminescent device, the base material layer 31 is located between the hole transport layer 4 and the quantum dot luminescent material 32, and a highest occupied molecular orbital energy level of the base material layer 31 is between a highest occupied molecular orbital energy level of the hole transport layer 4 and a highest occupied molecular orbital energy level of the quantum dot luminescent material 32. In the process of injecting the holes from the hole transport layer 4 into the quantum dot luminescent layer 3, the base material layer 31 becomes a transition layer for transferring the holes from the hole transport layer 4 to the quantum dot luminescent material 32 because the base material layer 31 has a good energy level matching degree with the hole transport layer 4 and the quantum dot luminescent material 32. Therefore, the holes in the hole transport layer 4 can be easily injected into the quantum dot luminescent material 32 through the base material layer 31, thereby improving the efficiency of the hole injection from the hole transport layer 4 to the quantum dot luminescent layer 3, and making the hole migration easier, and thus improving the luminous efficiency of the quantum dot electroluminescent device.

For example, as illustrated in FIG. 4, when the above quantum dot electroluminescent device normally works, the hole transport process comprises the following steps:

Step S11, holes in the hole transport layer 4 are transferred to the base material layer 31 in the quantum dot luminescent layer 3, wherein the highest occupied molecular orbital energy level of the base material layer 31 is between the highest occupied molecular orbital energy level of the hole transport layer 4 and the highest occupied molecular orbital energy level of the quantum dot luminescent material 32;

Step S12, holes in the base material layer 31 are transferred to the quantum dot luminescent material 32 of the quantum dot luminescent layer 3.

As illustrated in FIG. 4, in the quantum dot electroluminescent device, the holes in the hole transport layer 4 are easy to be transferred to the base material layer 31 in the quantum dot luminescent layer 3 because the highest occupied molecular orbital energy level of the base material layer 31 is between the highest occupied molecular orbital energy level of the hole transport layer 4 and the highest occupied molecular orbital energy level of the quantum dot luminescent material 32. Similarly, the holes in the base material layer 31 are easy to be transferred to the quantum dot luminescent material 32 of the quantum dot luminescent layer 3. Therefore, the holes in the hole transport layer 4 are easy to be injected into the quantum dot luminescent material 32 through the base material layer 31, thereby improving the efficiency of the hole injection from the hole transport layer 4 to the quantum dot luminescent layer 3, and making the hole migration easier, and thus improving the luminous efficiency of the quantum dot electroluminescent device.

In the above quantum dot electroluminescent device, the highest occupied molecular orbital energy level of the base material layer 31, for example, is from about 5.4 ev to about 6.8 ev.

The highest occupied molecular orbital energy level of the hole transport layer 4 is from about 5.0 ev to about 5.3 ev; the highest occupied molecular orbital energy level of the quantum dot luminescent material 32 in the quantum dot luminescent layer 3 is about 6.8 ev; the energy level difference between the hole transport layer 4 and the quantum dot luminescent material 32 is large. Therefore, in a case that a highest occupied molecular orbital energy level of the base material layer 31 is from about 5.4 ev to about 6.8 ev, the highest occupied molecular orbital energy level of the base material layer 31 is between the highest occupied molecular orbital energy level of the hole transport layer 4 and the highest occupied molecular orbital energy level of the quantum dot luminescent material 32. As such, the base material layer 31 becomes a transition layer for transferring the holes from the hole transport layer 4 to the quantum dot luminescent material 32. Therefore, the holes are easier to be injected from the hole transport layer 4 to the quantum dot luminescent layer 3, and the efficiency of the hole migration is further enhanced, thereby improving the luminescence efficiency of the quantum dot electroluminescent device.

For example, the highest occupied molecular orbital energy level of the base material layer 31 in the quantum dot luminescent layer 3 is from about 5.8 ev to about 6.2 ev.

In one embodiment, as illustrated in FIG. 1, the base material layer 31 in the quantum dot luminescent layer 3 acts as a coating agent or a dispersant of the quantum dot luminescent material 32.

For example, the base material layer 31 in the quantum dot luminescent layer 3 is an organic material, an inorganic material, or a composite of an organic material and an inorganic material.

For example, the base material layer 31 is made in the following two manners:

Manner I, the base material layer 31 in the above quantum dot luminescent layer 3 is formed of a base material and an energy level transition material doped in the base material, wherein the highest occupied molecular orbital energy level of the energy level transition material is between the highest occupied molecular orbital energy level of the hole transport layer 4 and the highest occupied molecular orbital energy level of the quantum dot luminescent material 32.

Manner II, the base material layer 31 in the above quantum dot luminescent layer 3 is made of an energy level transition material, wherein the highest occupied molecular orbital energy level of the energy level transition material is between the highest occupied molecular orbital energy level of the hole transport layer 4 and the highest occupied molecular orbital energy level of the quantum dot luminescent material 32.

The base material layer 31 made in the above two manners allows the highest occupied molecular orbital energy level of the whole base material layer 31 to be between the highest occupied molecular orbital energy level of the hole transport layer 4 and the highest occupied molecular orbital energy level of the quantum dot luminescent material 32, so that the base material layer 31 becomes a transition between the hole transport layer 4 and the quantum dot luminescent material 32. As such, by means of the transition of the base material layer 31, the holes are easier to be injected from the hole transport layer 4 to the quantum dot luminescent layer 3, and the efficiency of the hole migration is further enhanced, thereby improving the luminescence efficiency of the quantum dot electroluminescent device.

In one embodiment, the energy level transition material may comprise at least one of the three types of organic materials: a phosphate organic compound; a thiol organic compound; and a carboxylic acid organic compound.

For example, the energy level transition material may comprise the following types:

Type I: the energy level transition material comprises the phosphate organic compound(s);

Type II: the energy level transition material comprises the thiol organic compound(s);

Type III: the energy level transition material comprises the carboxylic acid organic compound(s);

Type IV: the energy level transition material comprises the phosphate organic compound(s) and the thiol organic compound(s);

Type V: the energy level transition material comprises the phosphate organic compound(s) and the carboxylic acid organic compound(s);

Type VI: the energy level transition material comprises the carboxylic acid organic compound(s) and the thiol organic compound(s);

Type VII: the energy level transition material comprises the phosphate organic compound(s), the carboxylic acid organic compound(s) and the thiol organic compound(s).

In one embodiment, if the energy level transition material comprises at least two of the phosphate organic compound(s), the thiol organic compound(s), and the carboxylic acid organic compound(s), the energy level transition material is made by polymerization of the at least two.

In a case that the energy level transition material is Type IV, Type V, Type VI or Type VII, the energy level transition material is made by polymerization of two or three types of the organic materials.

In the above quantum dot electroluminescent device, the quantum dot luminescent layer 3 has a thickness of from about 10 nm to about 450 nm. For example, the thickness of the quantum dot luminescent layer 3 ranges from about 55 nm to about 400 nm.

The quantum dot luminescent material 32 in the quantum dot electroluminescent device comprises at least one of a red quantum dot material, a green quantum dot material and a blue quantum dot material.

In the above quantum dot electroluminescent device, the light produced by the quantum dot luminescent layer 3 exits from a side at which the first electrode 1 is located, and a transparent protective layer is disposed on a side of the first electrode 1 away from the quantum dot luminescent layer 3; and/or the light produced by the quantum dot luminescent layer 3 exits from a side at which the second electrode 5 is located, and a transparent protective layer 6 is disposed on a side of the second electrode 5 away from the quantum dot luminescent layer 3.

As illustrated in FIG. 1, a transparent protective layer 6 is disposed on a side of the second electrode 5 away from the quantum dot luminescent layer 3. The transparent protective layer 6 can protect the side from which the light of the quantum dot electroluminescent device exits and thus the whole quantum dot electroluminescent device. The transparent protective layer 6 may be a transparent substrate, such as a transparent glass substrate, a transparent resin substrate, etc.

What are described above is only related to the illustrative embodiments of the disclosure, and not limitative to the scope of the disclosure. The protection scope of the disclosure is defined by the accompanying claims.

The application claims priority to the Chinese patent application No. 201610055724.5, filed on Jan. 27, 2016, the entire disclosure of which is incorporated herein by reference as part of the present application.

What is claimed is:

1. A quantum dot electroluminescent device, comprising: a first electrode, an electron transport layer, a quantum dot luminescent layer, a hole transport layer and a second electrode; wherein the quantum dot luminescent layer is disposed between the electron transport layer and the hole transport layer;

the quantum dot luminescent layer comprises a base material layer and a quantum dot luminescent material which is dispersed in the base material layer;

a highest occupied molecular orbital energy level of the base material layer is between a highest occupied molecular orbital energy level of the hole transport layer and a highest occupied molecular orbital energy level of the quantum dot luminescent material;

the base material layer is a composite of an organic material and an inorganic material.

2. The quantum dot electroluminescent device according to claim 1, wherein the highest occupied molecular orbital energy level of the base material layer is from about 5.4 ev to about 6.8 ev.

3. The quantum dot electroluminescent device according to claim 1, wherein the highest occupied molecular orbital energy level of the base material layer is from about 5.8 ev to 6.2 about ev.

4. The quantum dot electroluminescent device according to claim 1, wherein the base material layer acts as a coating agent or a dispersant of the quantum dot luminescent material.

5. The quantum dot electroluminescent device according to claim 1, wherein the base material layer is formed of a base material and an energy level transition material doped in the base material;

a highest occupied molecular orbital energy level of the energy level transition material is between the highest occupied molecular orbital energy level of the hole transport layer and the highest occupied molecular orbital energy level of the quantum dot luminescent material.

6. The quantum dot electroluminescent device according to claim 5, wherein the energy level transition material comprises at least one of the following organic materials: a phosphate organic compound(s); a thiol organic compound(s); and a carboxylic acid organic compound(s).

7. The quantum dot electroluminescent device according to claim 6, wherein in a case that the energy level transition material comprises at least two of the phosphate organic compound(s), the thiol organic compound(s), and the carboxylic acid organic compound(s), and the energy level transition material is made by polymerization of the at least two.

8. The quantum dot electroluminescent device according to claim 1, wherein the quantum dot luminescent layer has a thickness of from about 10 nm to about 450 nm.

9. The quantum dot electroluminescent device according to claim 1, wherein the quantum dot luminescent layer has a thickness of from about 55 nm to about 400 nm.

10. The quantum dot electroluminescent device according to claim 1, wherein the quantum dot luminescent material comprises at least one of a red quantum dot material, a green quantum dot material and a blue quantum dot material.

11. The quantum dot electroluminescent device according to claim 1, wherein the light produced by the quantum dot luminescent layer exits from a side at which the first electrode is located, and a transparent protective layer is disposed on a side of the first electrode away from the quantum dot luminescent layer; and/or the light produced by the quantum dot luminescent layer exits from a side at which the second electrode is located, and a transparent protective layer is disposed on a side of the second electrode away from the quantum dot luminescent layer.

12. A display apparatus comprising the quantum dot electroluminescent device according to claim 1.

13. The quantum dot electroluminescent device according to claim 2, wherein the quantum dot luminescent layer has a thickness of from about 10 nm to about 450 nm.

14. The quantum dot electroluminescent device according to claim 3, wherein the quantum dot luminescent layer has a thickness of from about 10 nm to about 450 nm.

15. The quantum dot electroluminescent device according to claim 2, wherein the quantum dot luminescent layer has a thickness of from about 55 nm to about 400 nm.

16. The quantum dot electroluminescent device according to claim 2, wherein the quantum dot luminescent material comprises at least one of a red quantum dot material, a green quantum dot material and a blue quantum dot material.

17. A quantum dot electroluminescent device, comprising: a first electrode, an electron transport layer, a quantum dot luminescent layer, a hole transport layer and a second electrode; wherein the quantum dot luminescent layer is disposed between the electron transport layer and the hole transport layer;

the quantum dot luminescent layer comprises a base material layer and a quantum dot luminescent material which is dispersed in the base material layer;

a highest occupied molecular orbital energy level of the base material layer is between a highest occupied molecular orbital energy level of the hole transport layer and a highest occupied molecular orbital energy level of the quantum dot luminescent material;

the base material layer is an organic material, the base material layer is made of an energy level transition material, and the energy level transition material comprises at least one of the following organic materials: a phosphate organic compound(s); a thiol organic compound(s); and a carboxylic acid organic compound(s).

18. The quantum dot electroluminescent device according to claim 17, wherein in a case that the energy level transition material comprises at least two of the phosphate organic compound(s), the thiol organic compound(s), and the carboxylic acid organic compound(s), and the energy level transition material is made by polymerization of the at least two.

19. A quantum dot electroluminescent device, comprising: a first electrode, an electron transport layer, a quantum dot luminescent layer, a hole transport layer and a second electrode; wherein the quantum dot luminescent layer is disposed between the electron transport layer and the hole transport layer;

the quantum dot luminescent layer comprises a base material layer and a quantum dot luminescent material which is dispersed in the base material layer;

a highest occupied molecular orbital energy level of the base material layer is between a highest occupied molecular orbital energy level of the hole transport layer and a highest occupied molecular orbital energy level of the quantum dot luminescent material;

the base material layer is an inorganic material.

20. The quantum dot electroluminescent device according to claim 19, wherein the base material layer is formed of a base material and an energy level transition material doped in the base material, or the base material layer is made of an energy level transition material;

a highest occupied molecular orbital energy level of the energy level transition material is between the highest occupied molecular orbital energy level of the hole transport layer and the highest occupied molecular orbital energy level of the quantum dot luminescent material.

\* \* \* \* \*